US011089711B2

(12) United States Patent
Kodama et al.

(10) Patent No.: US 11,089,711 B2
(45) Date of Patent: Aug. 10, 2021

(54) WORKBENCH AND WIRING DUCT

(71) Applicant: MEIDENSHA CORPORATION, Tokyo (JP)

(72) Inventors: Akihiko Kodama, Ota (JP); Nobuo Okazaki, Hachioji (JP); Makoto Miwa, Shizuoka (JP); Shigenori Ikeda, Makinohara (JP); Yoshio Kijima, Tokyo (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 16/613,493

(22) PCT Filed: Mar. 6, 2018

(86) PCT No.: PCT/JP2018/008505
§ 371 (c)(1),
(2) Date: Nov. 14, 2019

(87) PCT Pub. No.: WO2018/211786
PCT Pub. Date: Nov. 22, 2018

(65) Prior Publication Data
US 2020/0413561 A1    Dec. 31, 2020

(30) Foreign Application Priority Data

May 19, 2017 (JP) .............................. JP2017-100092
May 19, 2017 (JP) .............................. JP2017-100094

(51) Int. Cl.
*H05K 7/14*     (2006.01)
*B24B 41/06*   (2012.01)
*H02B 1/36*    (2006.01)

(52) U.S. Cl.
CPC ........... *H05K 7/1491* (2013.01); *B24B 41/06* (2013.01); *H02B 1/36* (2013.01); *H05K 7/1488* (2013.01)

(58) Field of Classification Search
CPC .. H05K 7/1491; H05K 7/1488; H05K 5/0204; H05K 5/0234; H05K 7/183;
(Continued)

(56) References Cited

U.S. PATENT DOCUMENTS 75,579 A * 3/1868 Roux ..................... A47B 53/02
                                                312/199
976,339 A * 11/1910 Billburg ................ A47B 53/02
                                                312/200
(Continued)

FOREIGN PATENT DOCUMENTS

JP       53-97531 U      8/1978
JP       55-110513 A    8/1980
(Continued)

*Primary Examiner* — Ko H Chan
(74) *Attorney, Agent, or Firm* — Foley & Lardner LLP

(57) ABSTRACT

Workbench 6 is for operator performing interior maintenance of casing 2, and laid between casings 2a, 2b when separating casings. A pair of first supporting portions 61 are arranged parallel between casings so as to be able to horizontally support workbench body 60 when casings are in separating state. A pair of second supporting portions 62 are arranged parallel above bottom frame 21a of one casing 2a, and support one ends of first supporting portions 61 when workbench body 60 is in horizontal state. A pair of third supporting portions 63 are arranged parallel above bottom frame 21b with one ends of the third supporting portions 63, to which the other ends of first supporting portions 61 are pivotally fixed, overhanging from bottom frame 21b. Wiring holding section 71 of wiring duct 7 accommodating and
(Continued)

protecting wires in casing 2 holds wires under workbench 6 between casings in separating state.

16 Claims, 11 Drawing Sheets

(58) Field of Classification Search
CPC . H05K 7/18; H04Q 1/12; H04Q 1/064; B24B 41/06; H02B 1/36
See application file for complete search history.

(56) References Cited

U.S. PATENT DOCUMENTS

| | | | | |
|---|---|---|---|---|
| 2,004,896 | A * | 6/1935 | Knott | A47B 83/045 312/235.3 |
| 3,335,326 | A * | 8/1967 | Bonin | H02B 1/202 361/827 |
| 3,710,199 | A * | 1/1973 | Cignoni, Jr. | H05K 7/1491 361/827 |
| 4,744,001 | A * | 5/1988 | Krafft | H02B 11/127 200/50.26 |
| 5,443,312 | A * | 8/1995 | Schluter | H02B 1/36 312/201 |
| 5,454,637 | A * | 10/1995 | Williams | A47B 46/00 312/249.9 |
| 6,076,906 | A * | 6/2000 | Royal | A47B 46/00 312/223.1 |
| 6,318,824 | B1 * | 11/2001 | LaGrotta | E05D 3/022 312/322 |
| 6,501,020 | B2 * | 12/2002 | Grant | H02G 3/0456 174/50 |
| 7,042,732 | B2 * | 5/2006 | Hung | H05K 7/1421 312/223.1 |
| 7,277,273 | B2 * | 10/2007 | Smith | H05K 7/1488 211/26 |
| 7,535,717 | B2 * | 5/2009 | Lai | G06F 1/181 361/727 |
| 8,882,055 | B2 * | 11/2014 | Yang | H05K 7/1491 248/70 |
| 9,578,779 | B2 * | 2/2017 | Yi | A47B 21/06 |
| 9,844,163 | B2 * | 12/2017 | Zhu | H05K 7/1487 |
| 10,617,030 | B2 * | 4/2020 | Okazaki | H05K 5/0204 |
| 2014/0260731 | A1 * | 9/2014 | Devanand | F16H 25/20 74/89.23 |
| 2016/0135323 | A1 * | 5/2016 | Haroun | G06F 1/181 361/679.53 |

FOREIGN PATENT DOCUMENTS

| | | |
|---|---|---|
| JP | 59-040809 A | 3/1984 |
| JP | 60-140438 U | 9/1985 |
| JP | 07-307586 A | 11/1995 |
| JP | 11-145631 A | 5/1999 |
| JP | 2002-176275 A | 6/2002 |
| JP | 2002-176277 A | 6/2002 |
| JP | 2003-124656 A | 4/2003 |
| JP | 3107053 U | 1/2005 |
| JP | 2005-268458 A | 9/2005 |

* cited by examiner

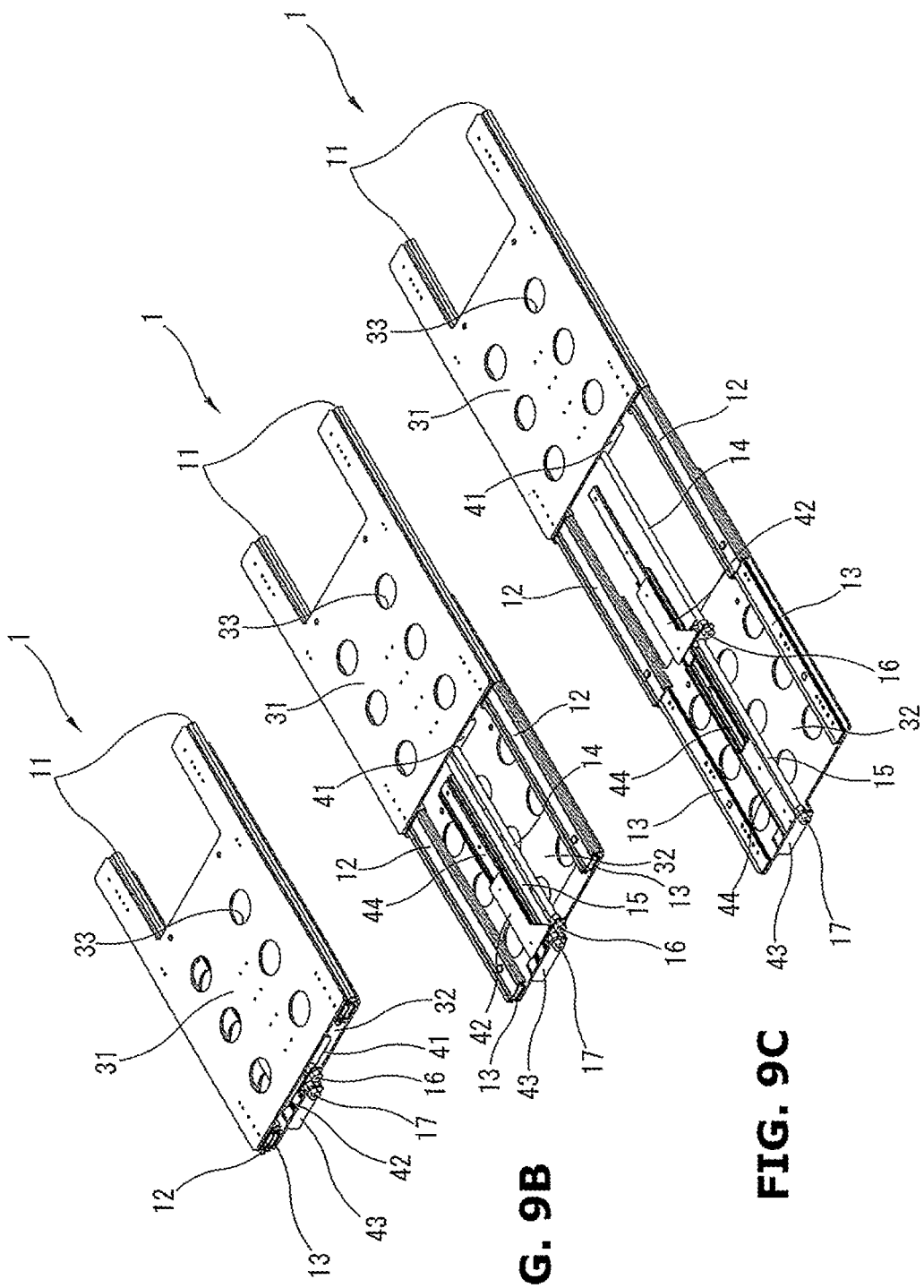

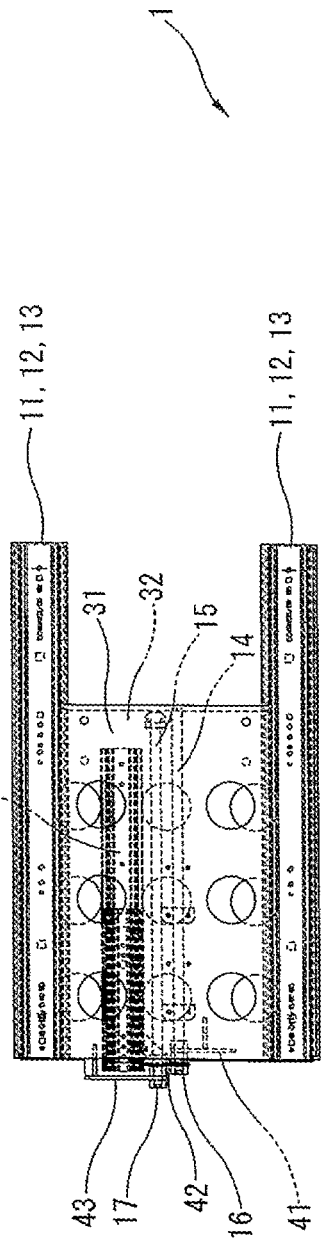
FIG. 10A
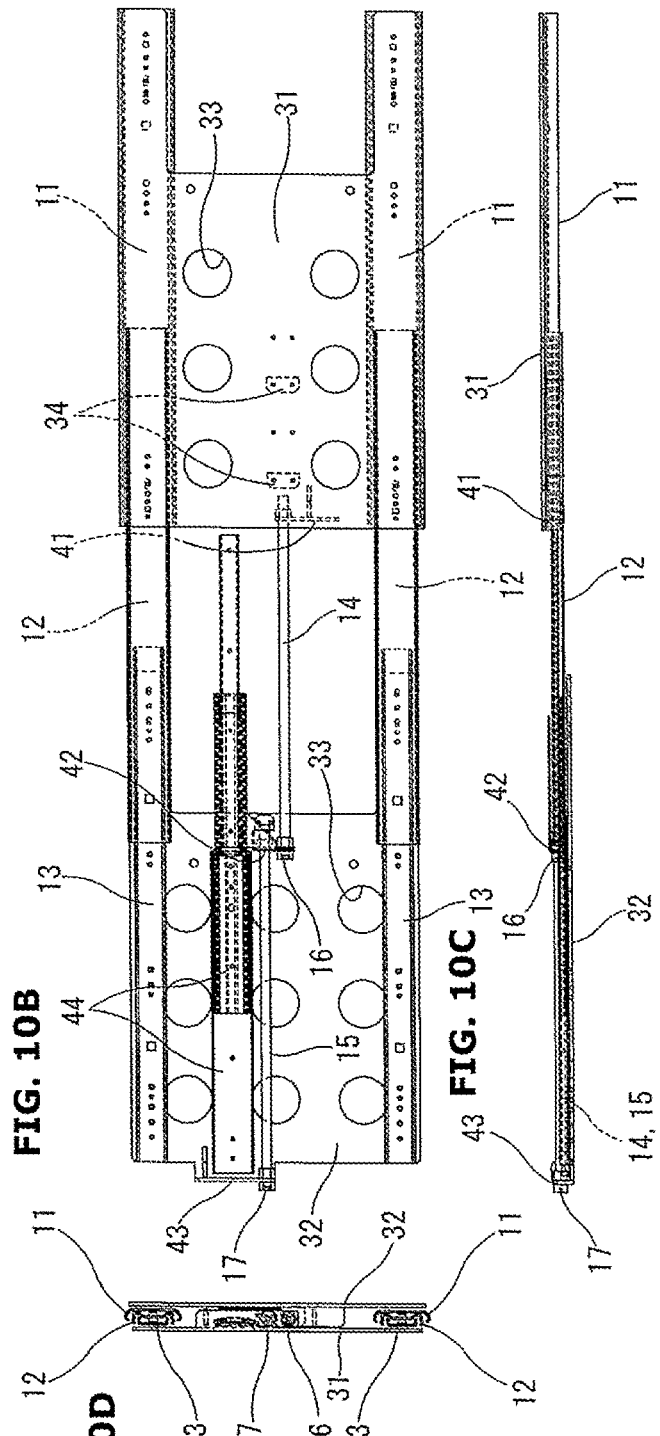
FIG. 10B
FIG. 10C
FIG. 10D

WORKBENCH AND WIRING DUCT

TECHNICAL FIELD

The present invention relates to a workbench and a wiring duct each provided in a casing that accommodates therein electronic equipment.

BACKGROUND ART

As a casing accommodating therein the electronic equipment, casings are disclosed in, for instance, Patent Documents 1 to 3.

The casing disclosed in Patent Document 1 is structured to be able to draw the electronic equipment from a casing body and carry out maintenance of the electronic equipment. The casings disclosed in Patent Documents 2 and 3 are structured to be able to, by moving a casing body from a wall surface of a building, secure a maintenance space between the casing body and the building wall surface.

CITATION LIST

Patent Document

Patent Document 1: Japanese Unexamined Patent Application Publication No. H07-307586
Patent Document 2: Japanese Unexamined Patent Application Publication No. H11-145631
Patent Document 3: Japanese Unexamined Patent Application Publication No. 2002-176277

SUMMARY OF THE INVENTION

In a case of the related art casings, when carrying out maintenance of the interior of the casing, an operator lifts out a workbench that is previously accommodated in the casing and sets or installs the workbench between a pair of separated casings by hand.

In this manner, in the case of the related art casings, since the workbench has to be set by hand when carrying out the maintenance of the interior of the casing, workability (working efficiency) of the maintenance of the interior of the casing becomes worse. Further, when setting the workbench that causes the worse workability (the low working efficiency) of the maintenance of the interior of the casing at a start of the maintenance, there is a risk of dropping the workbench.

In addition, in the case of the related art casings, although wires that are introduced in the casing may be placed and supported on an upper portion in the casing, if many wires are introduced in the casing, the casing needs reinforcement, and this results in a high cost to manufacture a structure of the casing. Moreover, when opening and closing (separating and connecting) the pair of casings for carrying out the maintenance of the interior of the casing, it is difficult to secure safety.

The present invention was made in view of the above technical problems. An object of the present invention is therefore to save the operator from having to set the workbench by hand when carrying out the maintenance of the interior of the casing and improve the safety and the workability (the working efficiency) at the maintenance of the interior of the casing. Further, the other object of the present invention is to reduce the manufacturing cost of the casing accommodating therein the wires while ensuring stability of a setting state of the casing without requiring the reinforcement of the structure of the casing even if the wires are introduced in the casing on a large scale.

Therefore, according to one aspect of the present invention, a workbench comprises: a workbench body accommodated in a pair of casings when the casings are in a connecting state, and horizontally supported between the pair of casings when the casings are in a separating state; a pair of first supporting portions horizontally supporting the workbench body when the casings are in the separating state; a pair of second supporting portions arranged parallel in a frame of one casing of the pair of casings, and supporting one ends of the first supporting portions when the workbench body is in a horizontal state; and a pair of third supporting portions arranged parallel in a frame of the other casing of the pair of casings with the third supporting portions overhanging from the frame of the other casing, and the other ends of the first supporting portions are pivotally fixed to the third supporting portions.

According to another aspect of the present invention, the first supporting portions are each provided at the one ends thereof with a first wheel that can move on an upper surface of the second supporting portion, and the first wheel supports the one end of the first supporting portion on the upper surface of the second supporting portion when the workbench body is in the horizontal state.

According to a further aspect of the invention, the workbench further comprises a pair of fourth supporting portions arranged in the frame of the one casing, and each having a vertical surface that supports the one end of the first supporting portion through the first wheel when the first wheel moves vertically in a process of connecting the pair of casings then the casings are in the connecting state.

According to a still further aspect of the invention, the workbench further comprises a pair of guiding portions provided in the frame of the one casing, and guiding the first wheels from the second supporting portions to the fourth supporting portions in the process of connecting the pair of casings.

According to a still further aspect of the invention, the first supporting portions are each provided at top end sides thereof with a second wheel that is guided to the fourth supporting portion by the guiding portion before the first wheel in the process of connecting the pair of casings.

According to a still further aspect of the invention, the workbench body can be attached to and detached from either of the pair of first supporting portions.

Further, according to one aspect of the present invention, a wiring duct comprises: a workbench accommodated in a pair of casings when the casings are in a connecting state, and laid between the pair of casings when the casings are in a separating state; and a wiring holding section accommodated in the pair of casings when the casings are in the connecting state, and set between the pair of casings and holding, under the workbench, a wire that is introduced in the casings when the casings are in the separating state.

According to another aspect of the present invention, the wiring duct further comprises an auxiliary wiring holding section rotatably coupled to one end edge of the wiring holding section and further holding the wire.

According to a further aspect of the invention, the auxiliary wiring holding section has a holding body holding the wire; and a pair of side wall portions formed so as to stand at both edges of the holding body.

According to a still further aspect of the invention, a cover to protect the wire held by the holding body is provided at either of the pair of side wall portions so as to be able to be attached to and detached from the either of the pair of side wall portions.

According to a still further aspect of the invention, a hanging member, which horizontally holds the holding body when the pair of casings are in the separating state and hangs and supports one end edge of the holding body so as to prevent the one end edge of the holding body from protruding from a frame of one casing of the pair of casings in processes of connecting and separating the casings, is fixed to the frame of the one casing.

According to the present invention described above, it is possible to save the operator from having to set the workbench by hand when carrying out the maintenance of the interior of the casing and improve the safety and the workability (the working efficiency) at the maintenance of the interior of the casing. Also, it is possible to reduce the manufacturing cost of the casing accommodating therein the wires while ensuring stability of the setting state of the casing without requiring the reinforcement of the structure of the casing even if the wires are introduced in the casing on a large scale.

BRIEF DESCRIPTION OF THE DRAWINGS

FIG. 9A is a perspective view of the casing separation mechanism, showing a state in which a second rail portion and a third rail portion are accommodated or retracted.

FIG. 9B is a perspective view of the casing separation mechanism, showing a state in which the third rail portion is extended.

FIG. 9C is a perspective view of the casing separation mechanism, showing a state in which the second rail portion and the third rail portion are extended.

FIG. 10A is a plan view of the casing separation mechanism, showing the state in which the second rail portion and the third rail portion are accommodated or retracted.

FIG. 10B is a plan view of the casing separation mechanism, showing the state in which the second rail portion and the third rail portion are extended.

FIG. 10C is a side view of the casing separation mechanism.

FIG. 10D is a front view of the casing separation mechanism.

EMBODIMENTS FOR CARRYING OUT THE INVENTION

Embodiments of the present invention will be explained below with reference to the drawings.

First Embodiment

Figure 1:
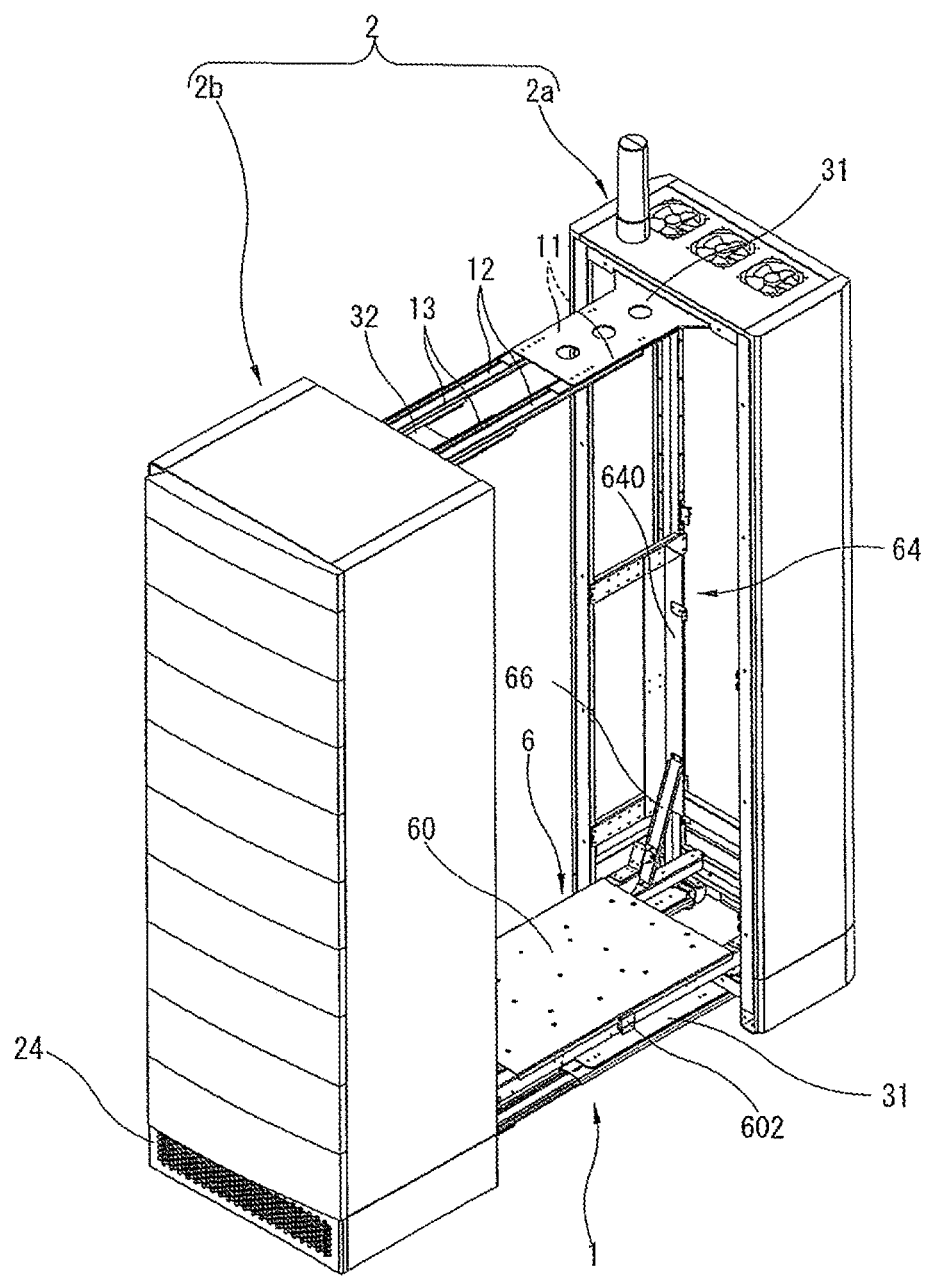
FIG. 1 is a perspective view of a casing having a casing separation mechanism, according to a first embodiment of the present invention.

A casing 2 shown as an example in FIG. 1 is formed from a pair of casings 2a and 2b that enclose or accommodate therein electronic equipment (not shown). The casing 2 further has a casing separation mechanism 1, a workbench 6 and a wiring duct 7 which are described below.

(Example of Aspect of Casing Separation Mechanism 1)

The casing separation mechanism 1 will be explained with reference to FIGS. 1 to 5.

Figure 2:
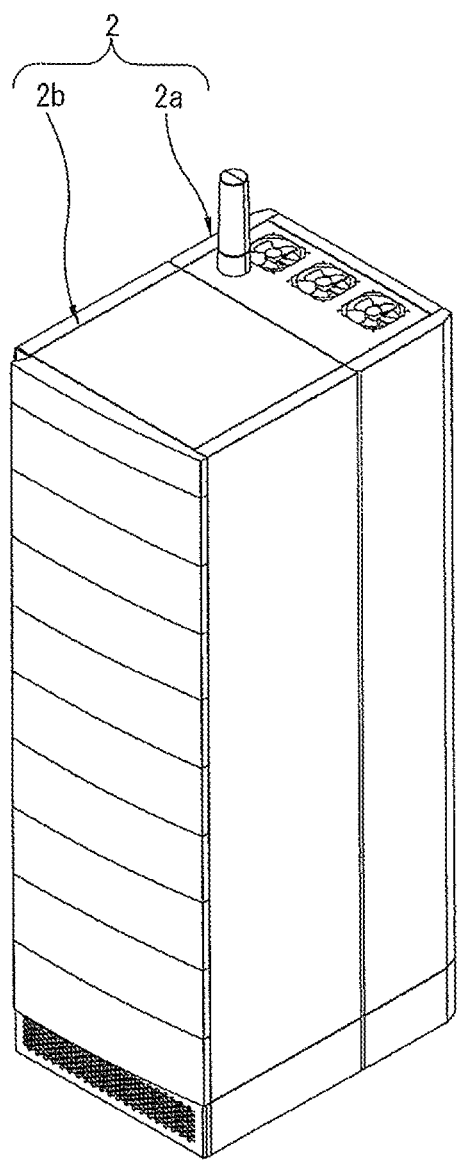
FIG. 2 is a perspective view of the casing, showing a connecting state by the casing separation mechanism.

As shown in FIGS. 1 and 2, the casing separation mechanism 1 is a mechanism that separates and connects one casing 2a and the other casing 2b of the pair of casings 2a and 2b that enclose or accommodate therein the electronic equipment (not shown).

Figure 3:
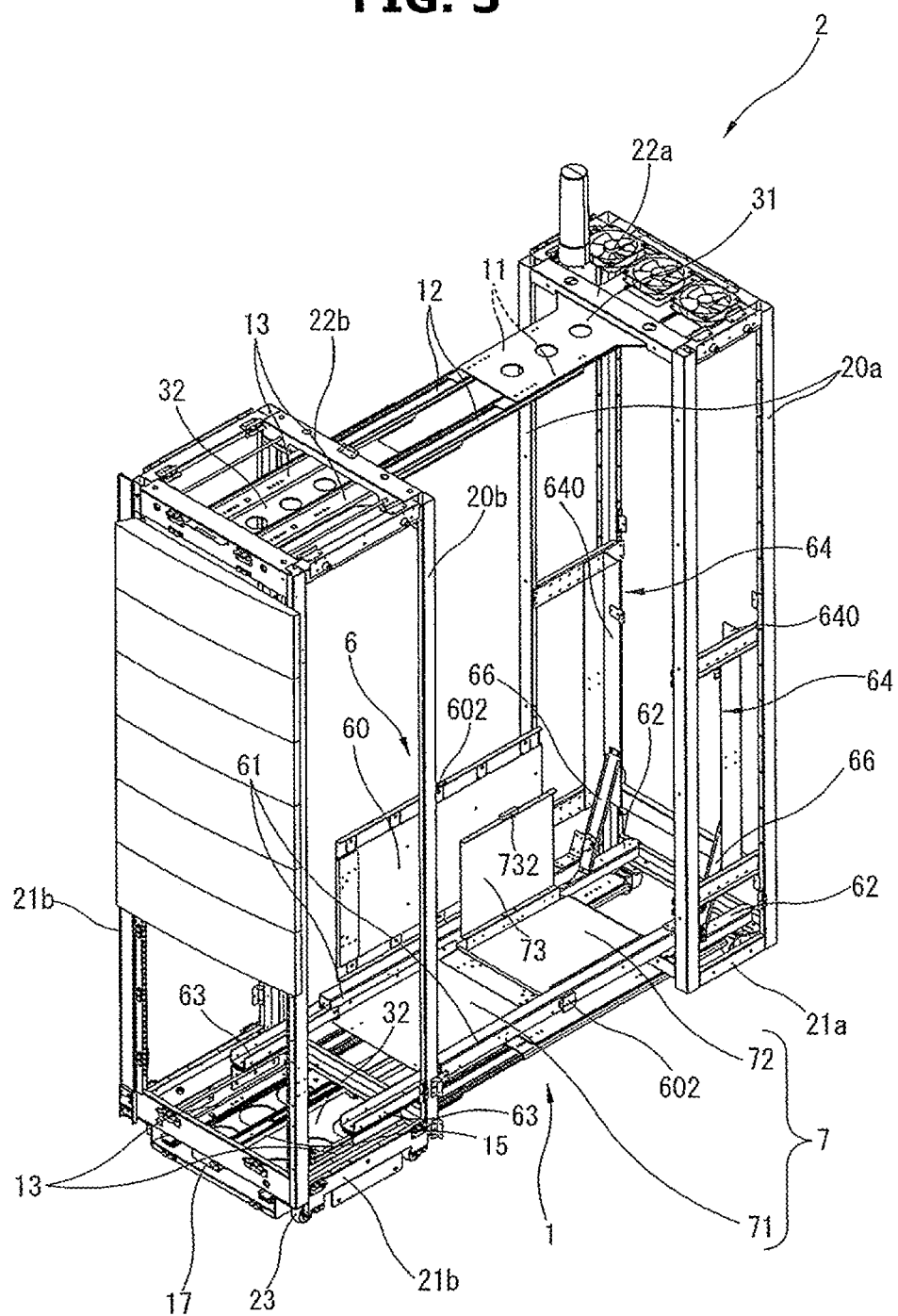
FIG. 3 is a perspective view of the casing with an upper cover, side covers and a front cover positioned close to a bottom of the casing being removed.

As shown in FIG. 3, the casing separation mechanism 1 is set in frames of the casings 2a and 2b, more specifically, bottom frames 21a and 21b and top frames 22a and 22b of the casings 2a and 2b.

The casing separation mechanism 1 shown in FIGS. 9A to 9C and 10A to 10D is a casing separation mechanism set in the bottom frames 21a and 21b. The casing separation mechanism of the present embodiment has a pair of rail portions 11, a pair of rail portions 12 and a pair of rail portions 13. The casing separation mechanism 1 further has a rail movement mechanism that extends the rail portion 12 and the rail portion 13 from one end of the rail portion 11 and from one end of the rail portion 12 respectively, and accommodates (or retracts) the rail portion 12 and the rail portion 13 in (or into) the rail portion 11 and in (or into) the rail portion 12 respectively.

On the other hand, the casing separation mechanism 1 set in the top frames 22a and 22b has a same structure as that of the casing separation mechanism 1 set in the bottom frames 21a and 21b except that the rail movement mechanism is not provided. Here, although the rail movement mechanism is provided in the bottom frames 21a and 21b, depending on a scale or sizes of the casings 2a and 2b, the rail movement mechanism is provided in either one or both of the top frames 22a and 22b and the bottom frames 21a and 21b.

(Example of Aspect of Rail Movement Mechanism)

The rail movement mechanism separates the casings 2a and 2b that are in a connecting state by extending the rail portion 12 from the one end of the rail portion 11.

The rail movement mechanism has a parallel connecting member 31 that connects or fixes the pair of rail portions 11 parallel and a drive mechanism (hereinafter, called a second drive mechanism), corresponding to a second drive mechanism of the present invention, which is provided at the parallel connecting member 31 and extends the rail portion 12 from the one end of the rail portion 11 and accommodates (or retracts) the rail portion 12 in (or into) the rail portion 11 so as to be able to stop the rail portion 12 during the progress of movement of the rail portion 12.

The rail movement mechanism further has a parallel connecting member 32 that connects or fixes the pair of rail portions 13 parallel and a drive mechanism (hereinafter, called a first drive mechanism), corresponding to a first drive mechanism of the present invention, which is provided at the parallel connecting member 32 and extends the rail portion 13 from the one end of the rail portion 12 and accommodates (or retracts) the rail portion 13 in (or into) the rail portion 12 so as to be able to stop the rail portion 13 during the progress of movement of the rail portion 13.

(Example of Aspect of First Drive Mechanism and Second Drive Mechanism)

The second drive mechanism has a rotation shaft 14 which is disposed between the pair of rail portions 12 and a supporting portion 41 which is provided at a portion on a front side of the parallel connecting member 31 and into which the rotation shaft 14 is screwed.

The first drive mechanism has a rotation shaft 15 which is disposed between the pair of rail portions 13, a supporting portion 42 which rotatably supports one end side of the rotation shaft 14 and into which the rotation shaft 15 is screwed and a supporting portion 43 which is provided at a portion on a front side of the parallel connecting member 32 and rotatably supports one end side of the rotation shaft 15.

As an aspect of the rotation shaft 14 and the rotation shaft 15, for instance, it is a bolt that is screwed into a nut that is applied to the supporting portion 41 and the supporting portion 42 as a bearing.

The rotation shaft 14 and the rotation shaft 15 are provided, at front end portions thereof, with tool receiving portions 16 and 17 respectively into which one end portion of a rotation shaft of a tool for rotating the rotation shaft 14 and the rotation shaft 15 is fitted.

As an aspect of the tool receiving portions 16 and 17, if a shape of the rotation shaft of the tool is a polygonal column (e.g. hexagonal column), it is a screw head having a polygonal hole (e.g. hexagonal hole) into which the rotation shaft of the tool is fitted. And, this screw head is fixed to each end portion of the rotation shaft 14 and the rotation shaft 15.

The supporting portion 41 and the supporting portion 42 each has the bearing to which each of the rotation shaft 14 and the rotation shaft 15 is fitted. As the bearing, for instance, it is the nut into which the bolt that is applied to the rotation shaft 14 and the rotation shaft 15 is screwed.

Here, the first drive mechanism and the second drive mechanism are not limited to the above aspects as long as the first drive mechanism and the second drive mechanism can move the rail portion 12 and the rail portion 13 forward and backward so as to be able to stop the rail portion 12 and the rail portion 13 during the progress of movement of the rail portion 12 and the rail portion 13. That is, as other aspects of the first drive mechanism and the second drive mechanism, instead of the rotation shaft 14 and the rotation shaft 15, for instance, an air cylinder and a hydraulic cylinder could be used. Each of these is one aspect of the first drive mechanism and the second drive mechanism of the present invention.

(Example of Aspect of Rail Portion 11, Rail Portion 12 and Rail Portion 13)

As shown in FIGS. 9A to 9C, the rail portions 11 are set in the bottom frame 21a of the one casing 2a of the pair of casings 2 with the pair of rail portions 11 overhanging from the bottom frame 21a.

Each of the rail portions 12 is structured to be able to extend from the one end of the rail portion 11 and retract into the rail portion 11 so as to be able to stop during the progress of movement of the rail portion 12 by the rail movement mechanism (by rotation of the rotation shaft 14).

The rail portions 13 are set in the bottom frame 21b of the other casing 2b of the pair of casings 2 with the pair of rail portions 13 overhanging from the bottom frame 21b. Further, each of the rail portions 13 is structured to be able to extend from the one end of the rail portion 12 and retract into the rail portion 12 so as to be able to stop during the progress of movement of the rail portion 13 by the rail movement mechanism (by rotation of the rotation shaft 15). Here, the bottom frame 21b is provided, at four corners on a lower surface thereof, with wheels 23.

The parallel connecting member 31 is positioned and secured on upper surfaces of the rail portions 11 so as to be accommodated in the other casing 2b when the pair of casings 2a and 2b are connected or joined together.

On the other hand, the parallel connecting member 32 is positioned and secured on lower surfaces of the rail portions 13 with the parallel connecting member 32 accommodated in the other casing 2b.

In a case where the casing separation mechanism 1 is set in the top frames 22a and 22b, as shown in FIG. 3, the rail portions 11 are set in the top frame 22a of the one casing 2a of the pair of casings 2 with the pair of rail portions 11 overhanging from the top frame 22a. On the other hand, the rail portions 13 are set in the top frame 22b of the other casing 2b of the pair of casings 2 with the pair of rail portions 13 overhanging from the top frame 22b.

(Example of Aspect of Parallel Connecting Member 31)

The parallel connecting member 31 is made of steel, and has a rectangular plate shape. A plurality of circular openings 33 are provided and arranged at a body of the parallel connecting member 31, thereby achieving weight reduction.

The supporting portion 41 of the second drive mechanism is fixed to the portion on the front side of the parallel connecting member 31 (in the present embodiment, a front portion on a lower surface side of the parallel connecting member 31).

The parallel connecting member 31 is provided, on the lower surface thereof, with horizontal supporting portions 34 that horizontally support the rotation shaft 14 when the rail portions 12 are accommodated in the rail portions 11.

A structure or configuration of the parallel connecting member 31 is not limited to the above as long as the parallel connecting member 31 can arrange the rail portions 11 parallel at regular intervals. That is, as other aspects of the parallel connecting member 31, for instance, an H-shaped rectangular plate structure, an oblong rectangular plate structure and a duckboard-like structure having a plurality of oblong rectangular plates could be used.

(Example of Aspect of Parallel Connecting Member 32)

The parallel connecting member 32 is also made of steel, and has a rectangular plate shape. Likewise, a plurality of circular openings 33 are provided and arranged at a body of the parallel connecting member 32, thereby achieving weight reduction.

The supporting portion 42 of the first drive mechanism is set above an upper surface of the parallel connecting member 32 so as to be able to move parallel to the pair of rail portions 13.

The supporting portion 43 of the first drive mechanism is fixed to the portion on the front side of the parallel connecting member 32 (in the present embodiment, a front portion on an upper surface side of the parallel connecting member 32).

Further, a guide portion 44 that guides the supporting portion 42 parallel to the pair of rail portions 13 is provided on or above the upper surface of the parallel connecting member 32.

A structure or configuration of the parallel connecting member 32 is not limited to the above as long as the parallel connecting member 32 can arrange the rail portions 13 parallel at regular intervals. That is, as other aspects of the parallel connecting member 32, for instance, an H-shaped rectangular plate structure, an oblong rectangular plate structure and a duckboard-like structure having a plurality of oblong rectangular plates could be used.

(Example of Aspect of Workbench 6)

The workbench 6 will be explained with reference to FIGS. 1 and 3 to 8.

The workbench 6 is a workbench for an operator who carries out maintenance of the interior of the casings 2a and 2b. When separating the casings 2a and 2b, as shown in FIG. 1, the workbench 6 is laid between the one casing 2a and the other casing 2b.

Figure 4:
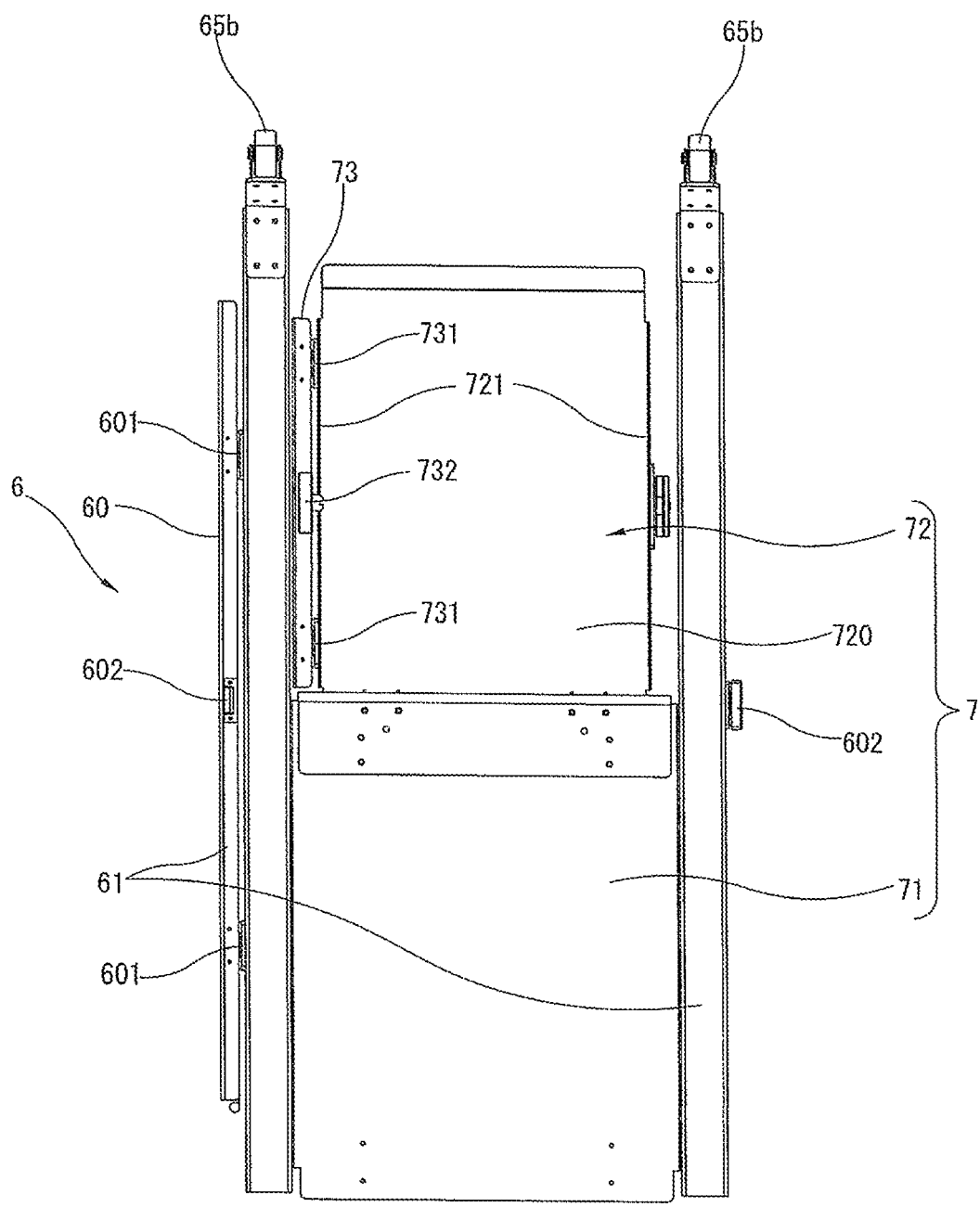
FIG. 4 is a plan view of a workbench and a wiring duct according to the first embodiment of the present invention.

As shown in FIGS. 3 and 4, the workbench 6 has a workbench body 60, first supporting portions 61, second supporting portions 62, third supporting portions 63 and fourth supporting portions 64.

The workbench body 60 is made of plate steel. The workbench body 60 is accommodated in the casings 2a and 2b when the casings 2a and 2b are in the connecting state, while the workbench body 60 is horizontally supported between the pair of casings 2a and 2b when the casings 2a and 2b are in a separating state.

The pair of first supporting portions 61 are arranged parallel between the casings 2a and 2b so as to be able to horizontally support the workbench body 60 when the casings 2a and 2b are in the separating state.

The workbench body 60 can be attached to and detached from one of the pair of first supporting portions 61 by fixing members 601. Further, a pair of securing members 602 for securing the workbench body 60 to the first supporting portion 61 are provided at the other of the pair of first supporting portions 61 and the workbench body 60.

The pair of second supporting portions 62 are arranged parallel on or above the bottom frame 21a of the one casing 2a, and support one ends of the first supporting portions 61 when the workbench body 60 is in a horizontal state.

The pair of third supporting portions 63 are arranged parallel on or above the bottom frame 21b of the other casing 2b with one ends of the third supporting portions 63, to which the other ends of the first supporting portions 61 are pivotally or rotatably fixed, overhanging from the bottom frame 21b, as shown in FIGS. 3 and 6 to 8.

Figure 5:
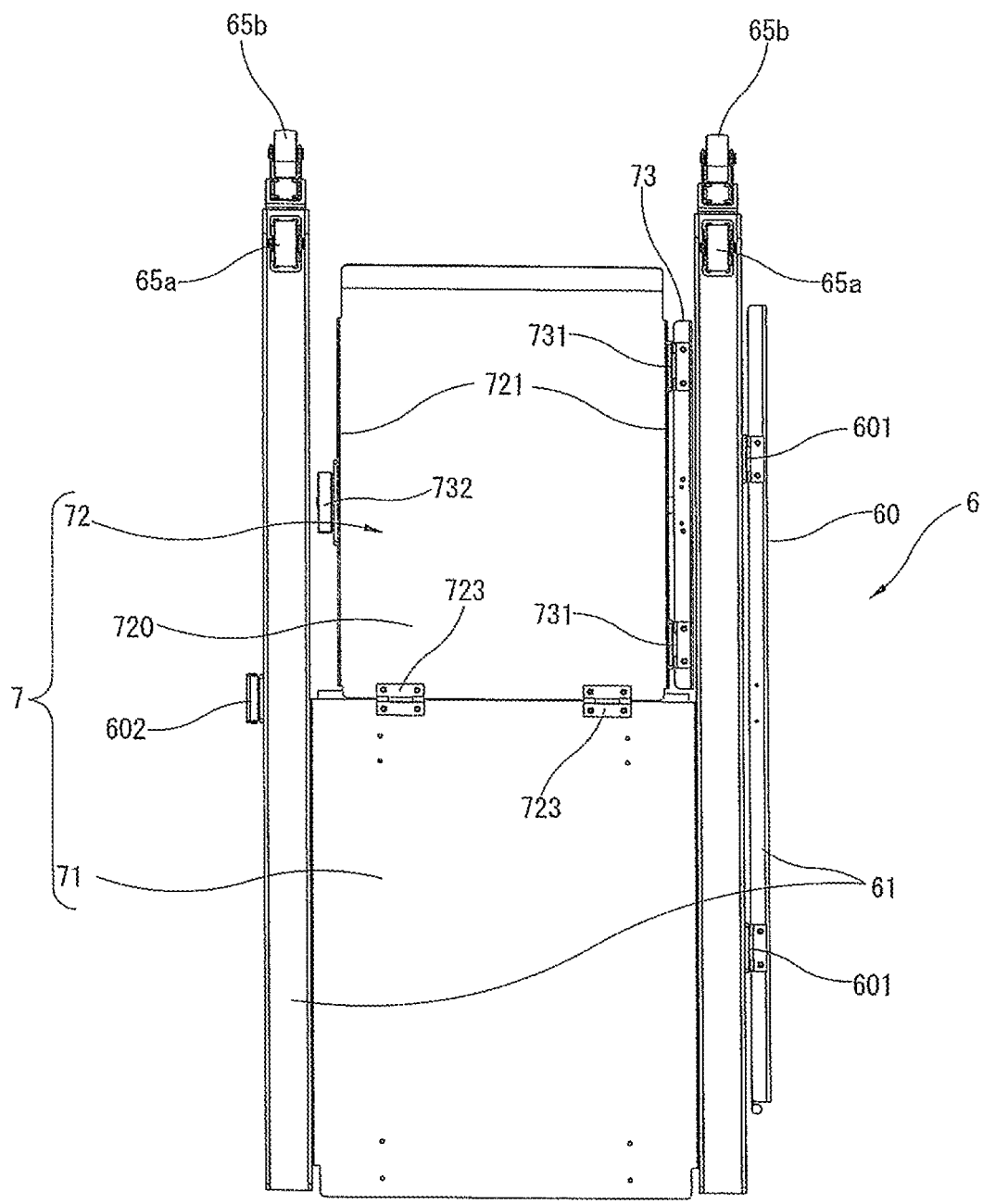
FIG. 5 is a bottom view of the workbench and the wiring duct.
Figure 6:
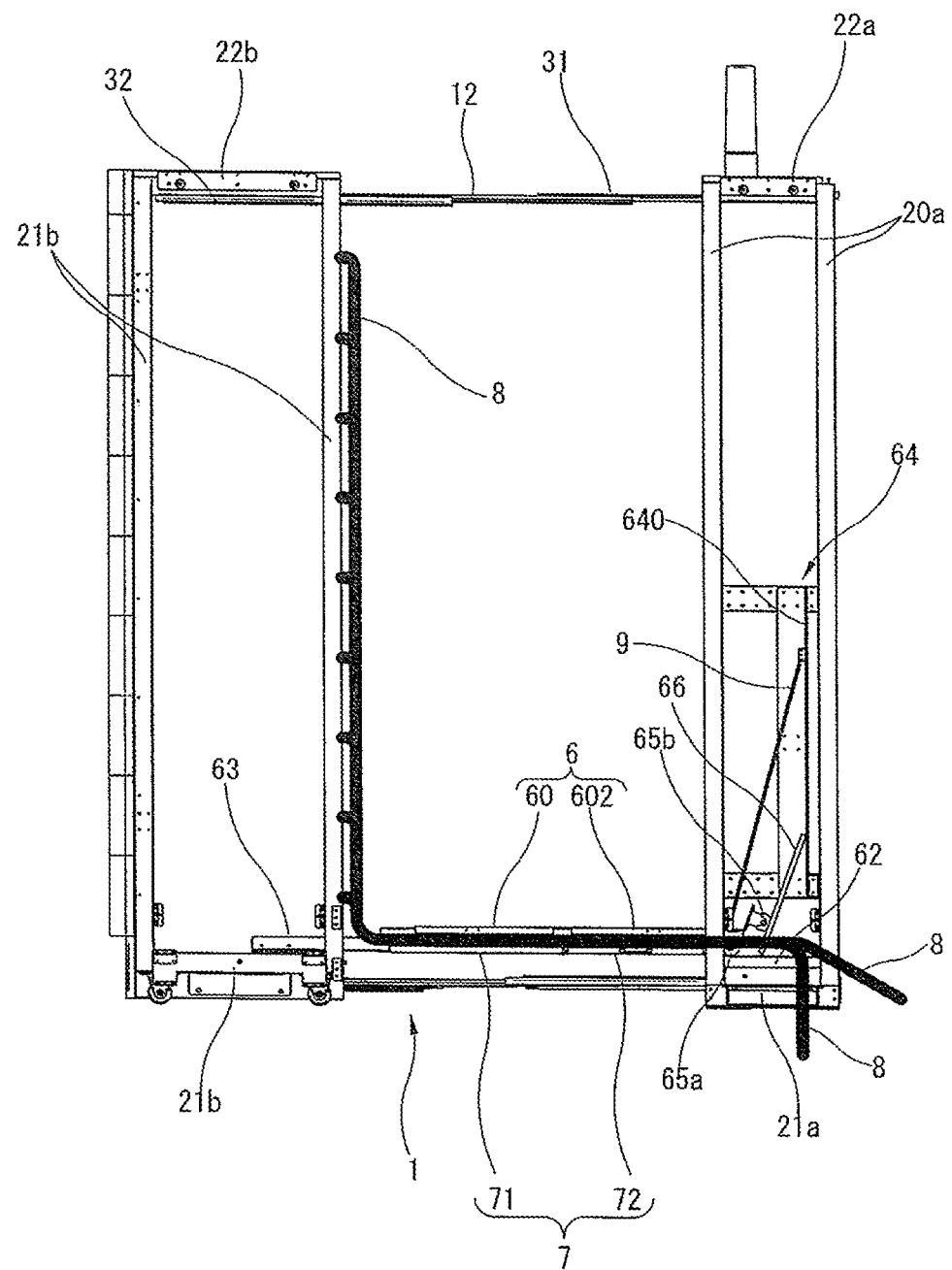
FIG. 6 is a side view of the casing in which a wire(s) is introduced, showing a separating state by the casing separation mechanism.

Further, as shown in FIGS. 5 and 6, the first supporting portions 61 are each provided at their one ends with a first wheel 65a that can move on an upper surface of the second supporting portion 62. This first wheel 65a supports the one end of the first supporting portion 61 on the upper surface of the second supporting portion 62 when the workbench body 60 of the workbench 6 is in the horizontal state.

The pair of fourth supporting portions 64 are arranged so as to stand in frames 20a of the casing 2a, as shown in FIG. 3. The fourth supporting portions 64 each have a vertical surface 640 that supports the one end of the first supporting portion 61 through the first wheel 65a when the first wheel 65a moves vertically in the process of connecting the casings 2a and 2b then the casings 2a and 2b are in the connecting state.

In addition, as shown in FIGS. 3 and 6 to 8, the frames 20a are provided with a pair of guiding portions 66 that guide the first wheels 65a from the second supporting portions 62 to the fourth supporting portions 64 in the process of connecting the casings 2a and 2b. More specifically, the pair of guiding portions 66 are set so as to stand on the second supporting portions 62 with the guiding portions 66 tilting with respect to the vertical surfaces 640 of the fourth supporting portions 64.

Figure 7:
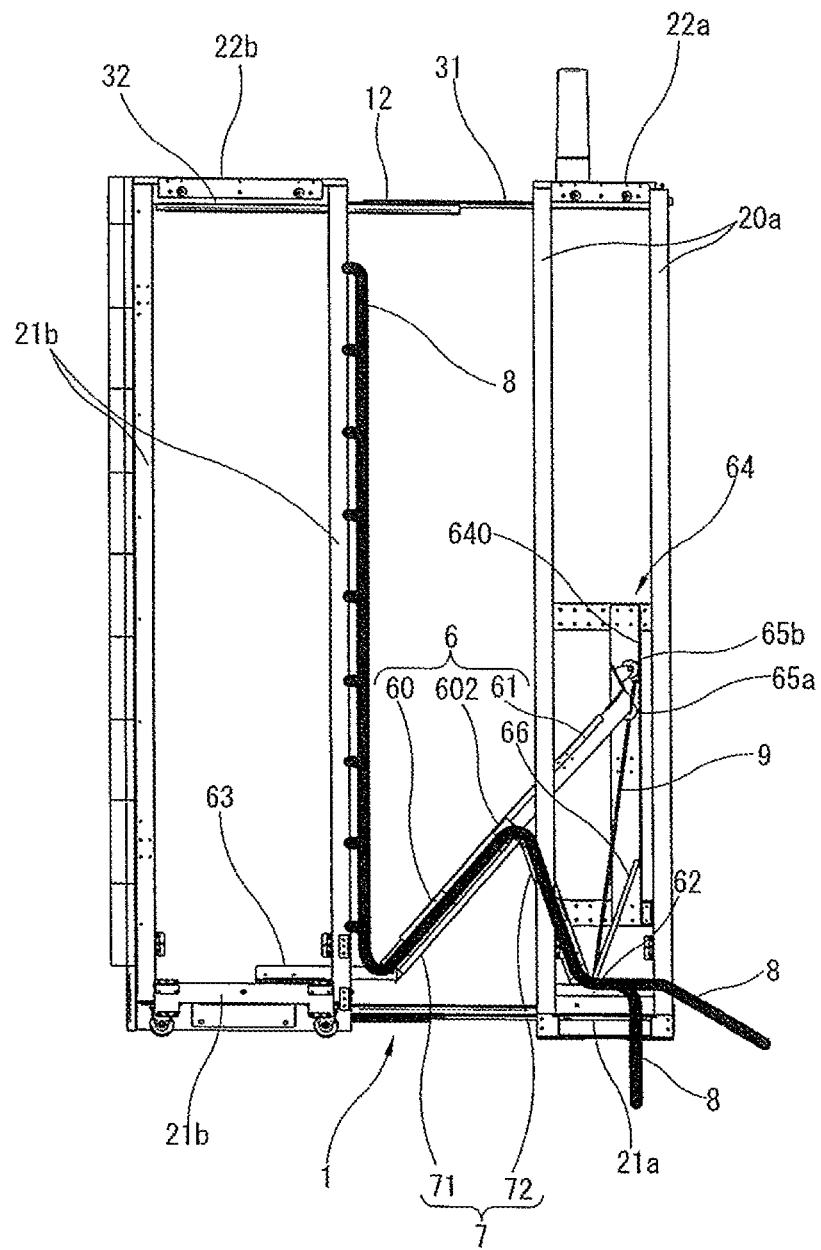
FIG. 7 is a side view of the casing in which the wire(s) is introduced, in the process of separating or connecting the casing.
Figure 8:
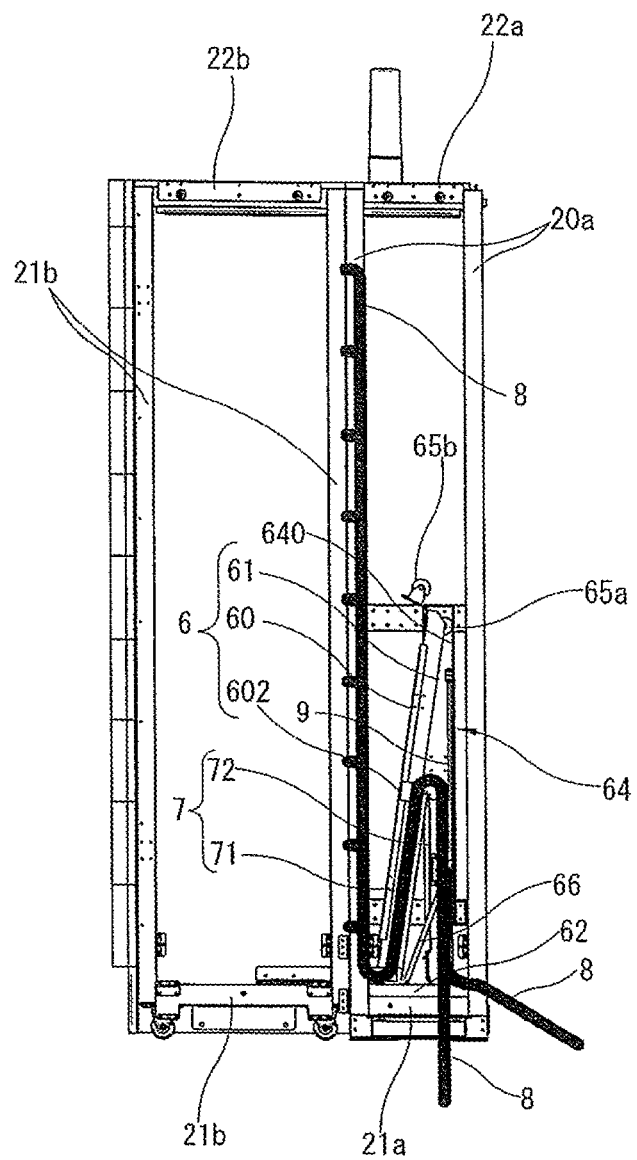
FIG. 8 is a side view of the casing in which the wire(s) is introduced, showing the connecting state.

Furthermore, as shown in FIGS. 4 and 5, the first supporting portions 61 are each provided at their top end sides with a second wheel 65b that is guided to the fourth supporting portion 64 by the guiding portion 66 before (or in advance of) the first wheel 65a in the process of connecting the casings 2a and 2b as shown in FIGS. 6 to 8.

(Example of Aspect of Wiring Duct 7)

The wiring duct 7 will be explained with reference to FIGS. 1 and 3 to 8.

As shown in FIGS. 6 to 8, the wiring duct 7 is a duct to accommodate and protect a wire(s) 8 that is introduced in the casing 2. When separating the casings 2a and 2b, the wiring duct 7 is laid under the workbench 6 between the one casing 2a and the other casing 2b.

As shown in FIGS. 3 to 5, the wiring duct 7 has a wiring holding section 71 and an auxiliary wiring holding section 72.

The wiring holding section 71 is set between the pair of first supporting portions 61, and holds the wires 8 introduced in the casing 2 under the workbench 6 as shown in FIGS. 6 to 8.

The auxiliary wiring holding section 72 is rotatably coupled to one end edge of the wiring holding section 71 through coupling members 723, and holds the wires 8.

The auxiliary wiring holding section 72 has a holding body 720 that holds the wires 8 and a pair of side wall portions 721 that are formed so as to stand at both edges of the holding body 720 extending along the first supporting portions 61.

A cover 73 to protect the wires 8 held by the holding body 720 is provided at one of the pair of side wall portions 721 so as to be able to be attached to and detached from the one of the pair of side wall portions 721 by coupling members 731. Further, a pair of securing members 732 for securing the cover 73 to the side wall portion 721 are provided at the cover 73 and the other of the pair of side wall portions 721.

Further, as shown in FIGS. 6 to 8, a pair of hanging members 9 are provided in the frames 20a of the one casing 2a, and fastened or fixed to the pair of fourth supporting portions 64. These pair of hanging members 9 horizontally hold the holding body 720 of the auxiliary wiring holding section 72 when the casings 2a and 2b are in the separating state. On the other hand, these pair of hanging members 9 hang and support vicinities of both ends of one end edge of the holding body 720 so as to prevent the one end edge of the holding body 720 from protruding from the frames 20a in the processes of connecting and separating the casings 2a and 2b.

As the hanging member 9, for instance, it is a restiform member (a wire rope) made of known material such as rope or chain, which can horizontally hold the holding body 720.

(Example of Movement of Casing Separation Mechanism 1)

Examples of the movement of the casing separation mechanism 1 will be explained with reference to FIGS. 1 to 3, 9 and 10.

First, the movement of the casing separation mechanism 1 when separating the casing 2a and the casing 2b will be explained.

When the casing 2a and the casing 2b are in the connecting state, as shown in FIGS. 9A and 10A, the rail portions 12 are accommodated in the rail portions 11, and the rail portions 13 are accommodated in the rail portions 12. Here, when removing a bottom front cover 24 of the bottom frame 21b shown in FIG. 1, the tool receiving portions 16 and 17 of the rotation shaft 14 and the rotation shaft 15 are exposed from a front lower end portion of the bottom frame 21b as shown in FIG. 3.

Next, when fitting a tip end of the rotation shaft of the tool into the tool receiving portion 16 of the rotation shaft 14 shown in FIG. 9A and rotating the rotation shaft 14 in a counterclockwise direction, the rotation shaft 14 comes out of the supporting portion 41 to a front side of the supporting portion 41. At this time, as shown in FIG. 9B, the rail portions 12 are extended from front side end portions of the rail portions 11, and also, at the top frame 22a and 22b side, the rail portions 12 are extended from the one ends of the rail portions 11. By and according to this movement, the wheels 23 of the bottom frame 21b roll on a floor in a forward direction of the casing 2. Then, when a stopper of one end portion of the rotation shaft 14 contacts the supporting portion 41, the casing 2b is separate from the casing 2a in the forward direction of the casing 2 by a distance of the extension of the rail portion 12.

Next, when intending to secure a further space between the casing 2a and the casing 2b, the tip end of the rotation shaft of the tool is fitted into the tool receiving portion 17 of the rotation shaft 15, and the rotation shaft 15 is rotated in the counterclockwise direction. Then, the rotation shaft 15 comes out of the supporting portion 42 to a front side of the supporting portion 42. At this time, as shown in FIGS. 9C, 10B and 10C, the rail portions 13 are extended from front side end portions of the rail portions 12, and also, at the top frame 22a and 22b side, the rail portions 13 are extended from the one ends of the rail portions 12. By and according to this movement, the wheels 23 of the bottom frame 21b roll on the floor in the forward direction of the casing 2. Then, when a stopper of a back side end portion of the rotation shaft 15 contacts the supporting portion 42, the casing 2b is further separate from the casing 2a in the forward direction of the casing 2 by a distance of the extension of the rail portion 12 and the rail portion 13.

As described above, in a state in which the casing 2a and the casing 2b are separate from each other as shown in FIG. 1, a maintenance space is secured between the casing 2a and the casing 2b. Subsequently, for instance, a terminal block as an electronic component is accommodated in the casing 2a, and the electronic equipment (not shown) is accommodated in the casing 2b. Further, by carrying out wiring by the operator who interposes himself/herself between the casing 2a and the casing 2b, the terminal block and the electronic equipment are electrically connected to each other.

Next, the movement of the casing separation mechanism 1 when connecting the casing 2a and the casing 2b will be explained.

After completing carrying out the wiring, a connecting operation (a joining operation) of the casing 2a and the casing 2b is performed. That is, when fitting the tip end of the rotation shaft of the tool into the tool receiving portion 17, shown in FIGS. 9C, 10B and 10C, of the rotation shaft 15 and rotating the rotation shaft 15 in a clockwise direction, the rotation shaft 15 is retracted to a back side of the supporting portion 42. At this time, the rail portions 13 are retracted into the rail portions 12, and at the top frame 22a and 22b side, the rail portions 13 are retracted into the rail portions 12. By and according to this movement, the wheels 23 of the bottom frame 21b roll on the floor in a backward direction of the casing 2. Then, when a stopper of the other end portion of the rotation shaft 15 contacts the supporting portion 42, as shown in FIG. 9B, the rail portions 13 are accommodated in the rail portions 12, and an interval between the casing 2a and the casing 2b is shortened by a distance of the accommodation of the rail portion 13.

Further, when fitting the tip end of the rotation shaft of the tool into the tool receiving portion 16 of the rotation shaft 14 and rotating the rotation shaft 14 in the clockwise direction, the rotation shaft 14 is retracted to a back side of the supporting portion 41. At this time, the rail portions 12 are retracted into the rail portions 11, and at the top frame 22a and 22b side, the rail portions 12 are retracted into the rail portions 11. By and according to this movement, the wheels 23 of the bottom frame 21b roll on the floor in the backward direction of the casing 2. Then, when a stopper of the other end portion of the rotation shaft 14 contacts the supporting portion 41, as shown in FIGS. 9A and 10A, the rail portions 12 are accommodated in the rail portions 11, and the casing 2a and the casing 2b are connected or joined together.

(Example of Movement of Workbench 6)

Examples of the movement of the workbench 6 will be explained with reference to FIGS. 1 to 8.

First, the movement of the workbench 6 in the process of separating the casings 2a and 2b will be explained.

When the casings 2a and 2b are in the connecting state as shown in FIG. 2, the workbench 6 is accommodated in the casing 2a as shown in FIG. 8. Then, by an operation of the casing separation mechanism 1, in the process of separation in which the casing 2b is separated from the casing 2a, the first wheel 65a of the workbench 6 which is positioned close to an upper end of the vertical surface 640 of the fourth supporting portion 64 in the frames 20a of the casing 2a gradually goes down on the vertical surface 640. On the other hand, the one end of the third supporting portion 63 which is located at a lower end side of the first supporting portion 61 is drawn from the frames 20a. By and according to this descent of the first wheel 65a, the one end of the first supporting portion 61 of the workbench 6 descends in the frames 20a. Subsequently, by the operation of the casing separation mechanism 1, in the process of separation in which the casing 2b is further separated from the casing 2a, the one end of the first supporting portion 61 further descends, and when the second wheel 65b of the workbench 6 reaches the vertical surfaces 640 as shown in FIG. 7, the first wheel 65a separates from the vertical surfaces 640. Further, by the operation of the casing separation mechanism 1, when the casing 2b is even further separated from the casing 2a and the one end of the first supporting portion 61 even further descends, the second wheel 65b descends while being guided by the guiding portion 66. Then, when the first wheel 65a reaches the second supporting portion 62 on or above the bottom frame 21a, as shown in FIGS. 1 and 6, the workbench body 60 of the workbench 6 is laid between the casings 2a and 2b.

Next, the movement of the workbench 6 in the process of connecting the casings 2a and 2b will be explained.

By an operation of the casing separation mechanism 1, in the process of connection in which the casing 2b is brought closer to the casing 2a, the first wheel 65a of the workbench 6 shown in FIG. 6 moves on the second supporting portion 62 toward the guiding portion 66. Further, as the casing 2b is brought closer to the casing 2a, the one end of the first supporting portion 61 of the workbench 6 further enters the frames 20a, then, as shown in FIG. 7, the second wheel 65b goes up in the frames 20a while being guided by the guiding portion 66. Subsequently, by the operation of the casing separation mechanism 1, in the process of connection in which the casing 2b is further brought closer to the casing 2a, the one end of the first supporting portion 61 further ascends in the frames 20a, and the first wheel 65a goes up in the frames 20*a* while being guided by the guiding portion 66. Then, when the first wheel 65*a* reaches the vertical surface 640 of the fourth supporting portion 64 as shown in FIG. 8, the second wheel 65*b* separates from the vertical surfaces 640. Further, by the operation of the casing separation mechanism 1, in the process of connection in which the casing 2*b* is even further brought closer to the casing 2*a*, the first wheel 65*a* goes up on the vertical surfaces 640. By and according to this ascent of the first wheel 65*a*, the one end of the first supporting portion 61 of the workbench 6 further ascends in the frames 20*a*. Then, when the casings 2*a* and 2*b* are connected together as shown in FIGS. 2 and 8, the workbench 6 is accommodated in the casing 2*a* with the one end of the first supporting portion 61 being supported on the vertical surface 640 around an upper end of the fourth supporting portion 64 through the first wheel 65*a* in the frames 20*a*.

(Example of Movement of Wiring Duct 7)

Examples of the movement of the wiring duct 7 will be explained with reference to FIGS. 1 to 8.

When the casings 2*a* and 2*b* are in the connecting state as shown in FIG. 2, the wiring duct 7 is accommodated in the casing 2*a* with the wiring holding section 71 and the auxiliary wiring holding section 72 being folded such that both undersides of the wiring holding section 71 and the auxiliary wiring holding section 72 substantially face to each other as shown in FIG. 8.

First, by an operation of the casing separation mechanism 1, when the first wheel 65*a* of the workbench 6 reaches the second supporting portion 62 on or above the bottom frame 21*a* by descent of the first wheel 65*a* in the frames 20*a*, as shown in the drawings from FIG. 8 to FIG. 6 through FIG. 7, the casings 2*a* and 2*b* are brought into the separating state. At this time, as shown in FIG. 6, the wiring holding section 71 of the wiring duct 7 is substantially horizontally set under the workbench 6 located between the casings 2*a* and 2*b*. The auxiliary wiring holding section 72 coupled to the one end edge of the wiring holding section 71 is also substantially horizontally set under the workbench 6 by the pair of hanging members 9 fixed to the frames 20*a*.

Subsequently, the wires 8 are introduced in the casings 2*a* and 2*b* from the outside. In the case of the casings 2*a* and 2*b* shown in FIGS. 6 to 8, the wires 8 are introduced from an opening of a rear portion at a lower end portion or around the lower end portion of the frames 20*a* of the casing 2*a*.

Then, in a state in which, as shown in FIG. 3, the workbench body 60 of the workbench 6 and the cover 73 of the auxiliary wiring holding section 72 stand or rise, as shown in FIG. 6, the wires 8 are connected to the electronic equipment (not shown) placed in the casing 2*b* with the wires 8 being arranged parallel on the wiring holding section 71 and the auxiliary wiring holding section 72. Further, the cover 73 shown in FIGS. 3 and 4 is fixed to the side wall portion 721 of the auxiliary wiring holding section 72 by the securing members 732. After that, as shown in FIG. 6, the workbench body 60 of the workbench 6 is fixed to the first supporting portion 61 by the securing members 602.

Afterwards, when the first wheel 65*a* of the workbench 6 in the frames 20*a* goes up through the guiding portion 66 and reaches the vicinity of the upper end of the fourth supporting portion 64 by the operation of the casing separation mechanism 1, as shown in the drawings from FIG. 6 to FIG. 8 through FIG. 7, the casings 2*a* and 2*b* are brought into the connecting state. At this time, the wiring duct 7 is folded and accommodated in the casings 2*a* and 2*b* with a part of the wires 8 being accommodated in this wiring duct 7.

Effect of First Embodiment

According to the casing 2 described above, the casing separation mechanism 1 is configured so that the rail portion 12 can be extended from the one end of the rail portion 11 by the rail movement mechanism, and also the rail portion 13 can be extended from the one end of the rail portion 12 by the rail movement mechanism. Therefore, the casing 2*a* and the casing 2*b* can be separated, thereby securing the maintenance space between the casing 2*a* and the casing 2*b*.

In particular, the other casing 2*b* can be stopped and settled at an arbitrary position during the progress of movement of the other casing 2*b*. It is therefore possible to secure an arbitrary space between the casing 2*a* and the casing 2*b* while ensuring safety during the movement of the casing 2*b*. As a consequence, even in the case where the electronic equipment is mounted in the casings 2*a* and 2*b* on a large scale, operator safety can be ensured when moving the casing 2*b* for the maintenance of the electronic equipment.

Further, when the casing 2*a* and the casing 2*b* are separated, the workbench 6 is laid between the casings 2*a* and 2*b*. It is therefore possible to save the operator who carries out the maintenance of the interior of the casings 2*a* and 2*b* from having to set the workbench between the casing 2*a* and the casing 2*b*. Hence, the safety and the workability (the working efficiency) at the maintenance of the interior of the casings 2*a* and 2*b* can be improved.

In addition, since the first supporting portion 61 of the workbench 6 has the first wheel 65*a* that is movable on the upper surface of the second supporting portion 62, operability (ease of operation) of the casing separation mechanism 1 when setting the workbench 6 between the casings 2*a* and 2*b* and when accommodating the workbench 6 in the casings 2*a* and 2*b* can be improved.

The fourth supporting portion 64 in the frames 20*a* has the vertical surface 640 supporting the one end of the first supporting portion 61 through the first wheel 65*a* when the first wheel 65*a* moves vertically in the process of connecting the casings 2*a* and 2*b* then the casings 2*a* and 2*b* are in the connecting state. Therefore, the workbench 6 can be stably supported when the casings 2*a* and 2*b* are in the connecting state. Also, the workbench 6 can be efficiently drawn from the frames 20*a* when separating the casings 2*a* and 2*b*.

Since the first wheel 65*a* in the frames 20*a* is guided by the guiding portion 66 in the processes of connecting and separating the casings 2*a* and 2*b*, workability when accommodating and laying the workbench 6 in and between the casings 2*a* and 2*b* is further improved.

Since the second wheel 65*b* provided at the top end of the first supporting portion 61 is guided to the fourth supporting portion 64 by the guiding portion 66 before (or in advance of) the first wheel 65*a* in the process of connecting the casings 2*a* and 2*b*, load of the operator when connecting the casings 2*a* and 2*b* can be lightened.

The workbench body 60 can be attached to and detached from either of the pair of first supporting portions 61. Therefore, the operator can arbitrarily stand the workbench body 60 at either of the pair of first supporting portions 61. As a consequence, when carrying out the maintenance of the interior of the casing 2, the operator can access the casing 2 from both sides of the casing 2 depending on an installation environment of the casing 2.

Further, since the wiring duct 7 is set at a bottom of the casing 2, the center of gravity of the casing 2 concentrates a lower portion of the casing 2, thereby improving stability of a setting state of the casing 2. This thus eliminates the need for reinforcement of a structure of the casing 2. Consequently, reduction in size and weight of the casing separation mechanism 1 (for example, reduction in weight of the casing separation mechanism 1 provided in the top frames 22a and 22b) can be achieved. Also, it is possible to reduce the manufacturing cost of the casing 2 accommodating therein the wires 8.

In addition, when the casings 2a and 2b are in the connecting state, the wiring duct 7 is accommodated in the casings 2a and 2b, while when the casings 2a and 2b are in the separating state, the wiring duct 7 is set between the casings 2a and 2b, and the wires 8 are held on the wiring duct 7 under the workbench 6. Therefore, the work space where the operator carries out the maintenance of the interior of the casing 2 is secured, thereby improving workability of the maintenance.

Furthermore, besides the wiring holding section 71, since the auxiliary wiring holding section 72 further holding the wires 8 are rotatably coupled to the one end edge of the wiring holding section 71, the wires 8 can be held more stably in the casing 2.

Moreover, since the pair of side wall portions 721 are formed so as to stand at the both edges of the holding body 720 of the auxiliary wiring holding section 72, the wires 8 introduced in the casing 2 can be surely held.

The cover 73 to protect the wires 8 held by the holding body 720 is provided at either of the pair of side wall portions 721 so as to be able to be attached to and detached from either of the pair of side wall portions 721. Therefore, the operator can arbitrarily stand the cover 73 at either of the pair of side wall portions 721. As a consequence, when carrying out maintenance of the wires 8, the operator can access the casing 2 from both sides of the casing 2 depending on the installation environment of the casing 2.

Since the auxiliary wiring holding section 72 (in particular, the holding body 720) of the wiring duct 7 is horizontally held in the frames 20a by the hanging members 9 when the casings 2a and 2b are in the separating state, the wires 8 can be held more stably.

On the other hand, in the processes of connecting and separating the casings 2a and 2b, the hanging members 9 prevent the one end edge of the auxiliary wiring holding section 72 (in particular, the one end edge of the holding body 720) from protruding from the frames 20a. Therefore, even though the wiring duct 7 is provided at the lower portion of the casing 2, it is possible to perform the connection and separation of the casings 2a and 2b without a hitch.

Second Embodiment

Figures 11A, 11B:
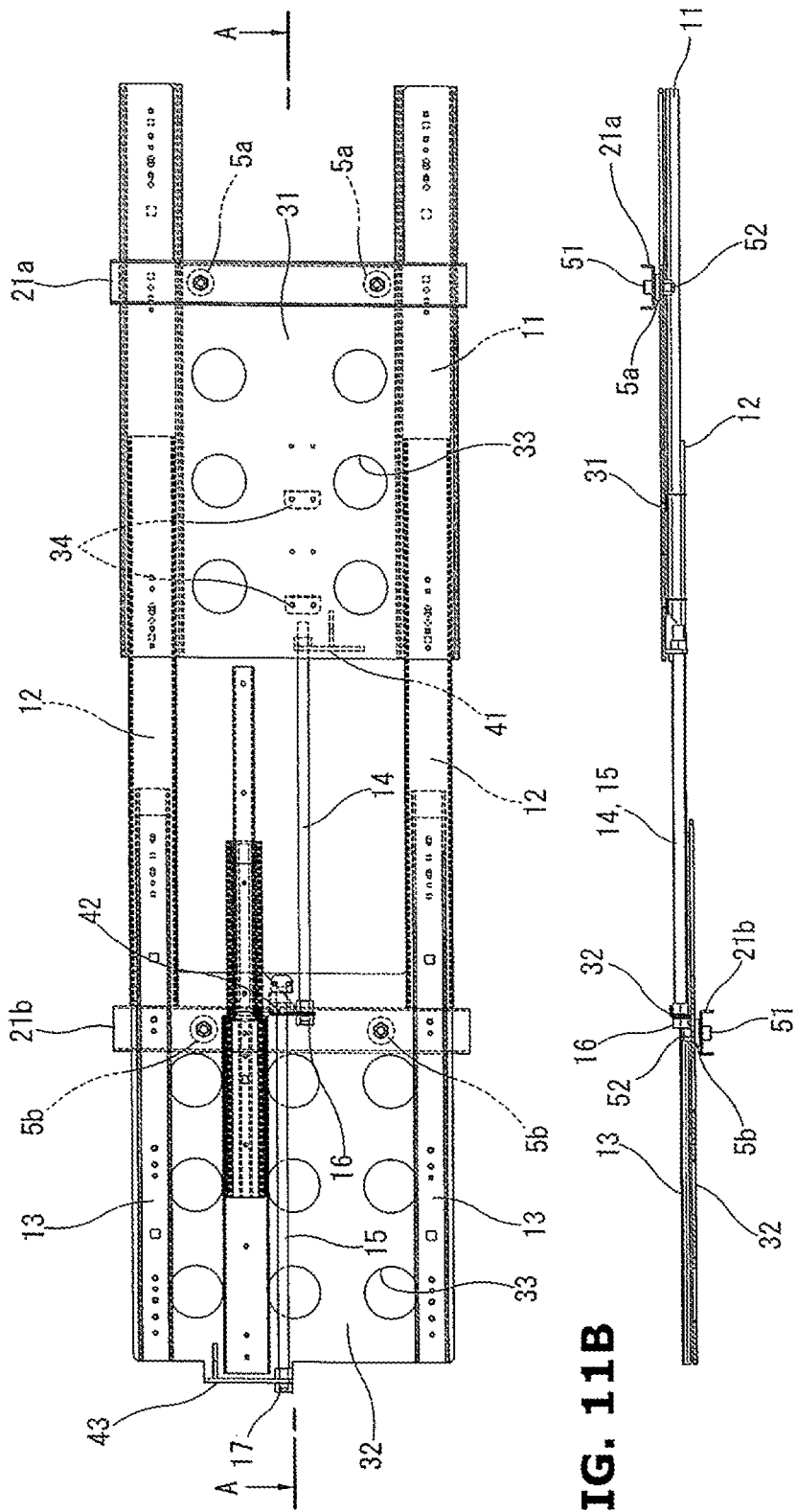
FIG. 11A is a plan view of a casing separation mechanism according to a second embodiment of the present invention.
FIG. 11B is a sectional view taken along a line A-A of FIG. 11A.

The casing separation mechanism 1 of the present invention shown in FIG. 11 further has first tilt absorption members 5a that absorb tilt of the rail portion 11 with the first tilt absorption members 5a interposed between the bottom frame 21a of the one casing 2a and the rail portion 11. The casing separation mechanism 1 further has second tilt absorption members 5b that absorb tilt of the rail portion 13 with the second tilt absorption members 5b interposed between the bottom frame 21b of the other casing 2b and the rail portion 13.

The first tilt absorption member 5a is fixed with a bolt 51 and a nut 52 with the first tilt absorption member 5a interposed between the bottom frame 21a of the one casing 2a and the parallel connecting member 31. On the other hand, the second tilt absorption member 5b is fixed with a bolt 51 and a nut 52 with the second tilt absorption member 5b interposed between the bottom frame 21b of the other casing 2b and the parallel connecting member 32.

In a case where the casing separation mechanism 1 is set in the top frames 22a and 22b, the first tilt absorption members 5a are disposed between the top frame 22a of the one casing 2a and the rail portion 11. On the other hand, the second tilt absorption members 5b are disposed between the top frame 22b of the other casing 2b and the rail portion 13.

As the first tilt absorption member 5a and the second tilt absorption member 5b, a rubber washer (an elastic washer) which is made of EPDM, silicon rubber, urethane rubber etc. and a plate spring, a coil spring and a hinge which are made of steel, could be used.

According to the above casing separation mechanism 1, the tilt of the rail portion 11 and the tile of the rail portion 13 in the bottom frames 21a and 21b and the top frames 22a and 22b of the casings 2a and 2b are absorbed by the first tilt absorption member 5a and the second tilt absorption member 5b respectively.

Hence, according to the casing separation mechanism 1 of the present embodiment, in addition to the effects of the first embodiment, a greater stability can be ensured when moving the casing 2b. Further, with this structure, the separating and connecting operations of the casing 2a and the casing 2b can be performed smoothly in a more stable state without being affected by inclination or distortion (or warp) of the floor of the building.

Third Embodiment

The present invention is not limited to the above first and second embodiments. The present invention can be modified in accordance with, for instance, a locational condition of the casing 2 within scope of claim.

As other aspects of the present invention, for instance, as will be described in the following aspect, the casing separation mechanism 1 of the first embodiment or the second embodiment is not provided with the rail portion 12 that is a third rail portion.

The casing separation mechanism 1 of the present embodiment has the pair of rail portions 11 which are arranged parallel to each other in the bottom frame 21a of the one casing 2a of the pair of casings 2 with the rail portions 11 overhanging from the bottom frame 21a, the pair of rail portions 13 which are set in the bottom frame 21b of the other casing 2b of the pair of casings 2 with the rail portions 13 overhanging from the bottom frame 21b and which are accommodated in the rail portions 11 so as to be able to extend from the one ends of the rail portions 11, and the rail movement mechanism which extends the rail portion 13 from the one end of the rail portion 11 and accommodates (or retracts) the rail portion 13 in (or into) the rail portion 11 so as to be able to stop the rail portion 13 during the progress of movement of the rail portion 13. This aspect is also an aspect of the present invention.

The rail movement mechanism has the parallel connecting member 32 that is set in the bottom frame 21b of the casing 2b and connects or fixes the pair of rail portions 13 parallel and the first drive mechanism that is provided at the parallel connecting member 32 and extends the rail portion 13 from the one end of the rail portion 11 and accommodates (or retracts) the rail portion 13 in (or into) the rail portion 11 so as to be able to stop the rail portion 13 during the progress of movement of the rail portion 13.

The first drive mechanism has the rotation shaft 15 which is disposed between the pair of rail portions 13, the supporting portion 42 into which the rotation shaft 15 is screwed and the supporting portion 43 which is provided at the portion on the front side of the parallel connecting member 32 and rotatably supports one end side of the rotation shaft 15.

Also in the present embodiment, the casing separation mechanism 1 is set in the top frames 22a and 22b of the casings 2a and 2b, and in the same manner as the first and second embodiments, the rail movement mechanism is not provided in the top frames 22a and 22b. Further, depending on a scale or sizes of the casings 2a and 2b, the rail movement mechanism is provided in either one or both of the top frames 22a and 22b and the bottom frames 21a and 21b.

It is obvious that the casing separation mechanism 1 of the third embodiment can obtain the same effects as those of the first embodiment and the second embodiment.

INDUSTRIAL APPLICABILITY

The casing separation mechanism 1 of the present invention can be utilized for, for instance, a control switchboard for electric equipment, a control console or a control board for accommodating a computer, and the like.

The invention claimed is:

1. A workbench comprising:
a workbench body accommodated in a pair of casings when the casings are in a connecting state, and horizontally supported between the pair of casings when the casings are in a separating state;
a pair of first supporting portions horizontally supporting the workbench body when the casings are in the separating state;
a pair of second supporting portions arranged parallel in a frame of one casing of the pair of casings, and supporting one ends of the first supporting portions when the workbench body is in a horizontal state; and
a pair of third supporting portions arranged parallel in a frame of the other casing of the pair of casings with the third supporting portions overhanging from the frame of the other casing, the other ends of the first supporting portions being pivotally fixed to the third supporting portions.

2. The workbench as claimed in claim 1, wherein:
the first supporting portions are each provided at the one ends thereof with a first wheel that can move on an upper surface of the second supporting portion, and the first wheel supports the one end of the first supporting portion on the upper surface of the second supporting portion when the workbench body is in the horizontal state.

3. The workbench as claimed in claim 2, further comprising:
a pair of fourth supporting portions arranged in the frame of the one casing, and each having a vertical surface that supports the one end of the first supporting portion through the first wheel when the first wheel moves vertically in a process of connecting the pair of casings then the casings are in the connecting state.

4. The workbench as claimed in claim 3, further comprising:
a pair of guiding portions provided in the frame of the one casing, and guiding the first wheels from the second supporting portions to the fourth supporting portions in the process of connecting the pair of casings.

5. The workbench as claimed in claim 4, wherein:
the first supporting portions are each provided at top end sides thereof with a second wheel that is guided to the fourth supporting portion by the guiding portion before the first wheel in the process of connecting the pair of casings.

6. The workbench as claimed in claim 1, wherein:
the workbench body can be attached to and detached from either of the pair of first supporting portions.

7. The workbench as claimed claim 2, wherein:
the workbench body can be attached to and detached from either of the pair of first supporting portions.

8. The workbench as claimed claim 3, wherein:
the workbench body can be attached to and detached from either of the pair of first supporting portions.

9. The workbench as claimed in claim 4, wherein:
the workbench body can be attached to and detached from either of the pair of first supporting portions.

10. The workbench as claimed claim 5, wherein:
the workbench body can be attached to and detached from either of the pair of first supporting portions.

11. A wiring duct comprising:
a workbench accommodated in a pair of casings when the casings are in a connecting state, and laid between the pair of casings when the casings are in a separating state; and
a wiring holding section accommodated in the pair of casings when the casings are in the connecting state, and set between the pair of casings and holding, under the workbench, a wire that is introduced in the casings when the casings are in the separating state.

12. The wiring duct as claimed in claim 11, further comprising:
an auxiliary wiring holding section rotatably coupled to one end edge of the wiring holding section and further holding the wire.

13. The wiring duct as claimed in claim 12, wherein:
the auxiliary wiring holding section has:
a holding body holding the wire; and
a pair of side wall portions formed so as to stand at both edges of the holding body.

14. The wiring duct as claimed in claim 13, wherein:
a cover to protect the wire held by the holding body is provided at either of the pair of side wall portions so as to be able to be attached to and detached from the either of the pair of side wall portions.

15. The wiring duct as claimed in claim 14, wherein:
a hanging member, which horizontally holds the holding body when the pair of casings are in the separating state and hangs and supports one end edge of the holding body so as to prevent the one end edge of the holding body from protruding from a frame of one casing of the pair of casings in processes of connecting and separating the casings, is fixed to the frame of the one casing.

16. The wiring duct as claimed in claim 15, wherein:
a hanging member, which horizontally holds the holding body when the pair of casings are in the separating state and hangs and supports one end edge of the holding body so as to prevent the one end edge of the holding body from protruding from a frame of one casing of the pair of casings in processes of connecting and separating the casings, is fixed to the frame of the one casing.

* * * * *